(12) United States Patent
Hao et al.

(10) Patent No.: US 10,672,352 B2
(45) Date of Patent: Jun. 2, 2020

(54) ARRAY SUBSTRATE, DISPLAY DEVICE AND DRIVING METHOD FOR DISPLAY DEVICE

(71) Applicant: BOE Technology Group Co., Ltd., Beijing (CN)

(72) Inventors: Xueguang Hao, Beijing (CN); Hongfei Cheng, Beijing (CN); Xinyin Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 79 days.

(21) Appl. No.: 15/569,310

(22) PCT Filed: May 24, 2017

(86) PCT No.: PCT/CN2017/085696
§ 371 (c)(1),
(2) Date: Oct. 25, 2017

(87) PCT Pub. No.: WO2018/040626
PCT Pub. Date: Mar. 8, 2018

(65) Prior Publication Data
US 2018/0308442 A1 Oct. 25, 2018

(30) Foreign Application Priority Data
Aug. 31, 2016 (CN) .......................... 2016 1 0798599

(51) Int. Cl.
*G09G 3/36* (2006.01)
*H01L 29/786* (2006.01)
(Continued)

(52) U.S. Cl.
CPC ......... *G09G 3/3648* (2013.01); *G02F 1/1368* (2013.01); *G02F 1/133528* (2013.01);
(Continued)

(58) Field of Classification Search
CPC ... G09G 3/3648; G09G 3/32; G02F 1/136286
See application file for complete search history.

(56) References Cited

U.S. PATENT DOCUMENTS 5,235,448 A    8/1993  Suzuki et al.
2002/0047822 A1*  4/2002  Senda ................. G09G 3/32
                                                345/90
(Continued)

FOREIGN PATENT DOCUMENTS

CN    1866527 A    11/2006
CN    1916706 A    2/2007
(Continued)

OTHER PUBLICATIONS

Aug. 23, 2017—(WO) International Search Report and Written Opinion Appn PCT/CN2017/085696 with English Tran.
(Continued)

*Primary Examiner* — Kevin M Nguyen
(74) *Attorney, Agent, or Firm* — Banner & Witcoff, Ltd.

(57) ABSTRACT

An array substrate, a display device and a driving method for a display device are provided. In the array substrate and the display device, one sub-pixel includes a first sub-pixel portion and a second sub-pixel portion adjacent to each other. The first sub-pixel portion and the second sub-pixel portion are connected to different gate lines and are electrically connected to the same data line, so that, in the case of progressive scanning, the first sub-pixel portion and the second sub-pixel portion are applied with different data voltages.

17 Claims, 7 Drawing Sheets

(51) Int. Cl.
  *H01L 27/12*   (2006.01)
  *G02F 1/1335*  (2006.01)
  *G02F 1/1343*  (2006.01)
  *G02F 1/1368*  (2006.01)
  *G09G 3/20*    (2006.01)
  *G02F 1/1362*  (2006.01)

(52) U.S. Cl.
  CPC ..... *G02F 1/134309* (2013.01); *G09G 3/2003* (2013.01); *G09G 3/3614* (2013.01); *G09G 3/3688* (2013.01); *H01L 27/124* (2013.01); *H01L 27/1222* (2013.01); *H01L 29/78696* (2013.01); *G02F 1/13624* (2013.01); *G02F 2001/134345* (2013.01); *G02F 2201/121* (2013.01); *G02F 2201/123* (2013.01); *G09G 2300/0447* (2013.01)

(56) References Cited

U.S. PATENT DOCUMENTS

| | | | | |
|---|---|---|---|---|
| 2003/0090603 | A1* | 5/2003 | Chae | G02F 1/1368 349/43 |
| 2006/0256248 | A1 | 11/2006 | Baek et al. | |
| 2008/0252624 | A1* | 10/2008 | Jang | G09G 3/3648 345/204 |
| 2008/0316413 | A1 | 12/2008 | Cho | |
| 2012/0086687 | A1* | 4/2012 | Tsubata | G09G 3/3659 345/92 |
| 2012/0319933 | A1 | 12/2012 | Chen | |
| 2012/0320297 | A1 | 12/2012 | Itsumi et al. | |
| 2012/0326954 | A1 | 12/2012 | Itsumi et al. | |
| 2013/0128168 | A1 | 5/2013 | Kim et al. | |
| 2013/0147698 | A1* | 6/2013 | Kang | G09G 3/3674 345/96 |
| 2015/0221273 | A1* | 8/2015 | Lee | G09G 3/3677 345/100 |

FOREIGN PATENT DOCUMENTS

| | | |
|---|---|---|
| CN | 102770802 A | 11/2012 |
| CN | 202916564 U | 5/2013 |
| CN | 106125408 A | 11/2016 |

OTHER PUBLICATIONS

Apr. 22, 2020 (CN) Office Action application 201610798599.7 with English Translation.

* cited by examiner

ARRAY SUBSTRATE, DISPLAY DEVICE AND DRIVING METHOD FOR DISPLAY DEVICE

The application is a U.S. National Phase Entry of International Application No. PCT/CN2017/085696 filed on May 24, 2017, designating the United States of America and claiming priority to Chinese Patent Application No. 201610798599.7, filed on Aug. 31, 2016. The present application claims priority to and the benefit of the above-identified applications and the above-identified applications are incorporated by reference herein in their entirety.

TECHNICAL FIELD

At least one embodiment of the present disclosure relates to an array substrate, a display device and a driving method for a display device.

BACKGROUND

Since in a Vertical Alignment (VA) display mode, a bi-refraction index of liquid crystal molecules differs greatly under different viewing angles, a color cast phenomenon is relatively severe.

Due to a 360-degree self-compensation role, a Continuous Pinwheel Alignment (CPA) technology is not severe in color shift. As a color cast improvement method for a Multi-domain Vertical Alignment (MVA) technology and a Patterned Vertical Alignment (PVA) technology, it is necessary to design as many display domains as possible. In physical structure, in order to enable the liquid crystal molecules and orthogonal light transmission axes of upper and lower polarizing films to form included angles of 45 degrees, 4 domains can be designed at most. A general 8-domain design is based on an electrical principle, such that in the same sub-pixel, rotary angles of the liquid crystal molecules of 4 domains are different from those of the liquid crystal molecules of the other 4 domains, 8 different liquid crystal orientation modes are realized, to realize 8-domain display. The general 8-domain design mainly has a capacitive coupling technology, a dual-thin film transistor (TFT) technology, a charge share technology and a Vcom voltage modulation technology. The dual-TFT technology adopts different TFT arrangement modes and different data line voltage driving methods, and has greater influence on a compensation effect of the color cast and charging and discharging efficiencies of pixels.

SUMMARY

At least one embodiment of the present disclosure provides an array substrate, including a plurality of sub-pixels arranged in a plurality of rows and a plurality of columns, wherein each sub-pixel includes a first sub-pixel portion and a second sub-pixel portion adjacent to each other, the first sub-pixel portion includes a first thin film transistor and a first pixel electrode, and the first thin film transistor includes a first gate electrode, a first source electrode and a first drain electrode, the second sub-pixel portion includes a second thin film transistor and a second pixel electrode, and the second thin film transistor includes a second gate electrode, a second source electrode and a second drain electrode, and the first drain electrode is electrically connected to the first pixel electrode, the second drain electrode is electrically connected to the second pixel electrode, the first source electrode and the second source electrode are electrically connected to a same data line, the first gate electrode is electrically connected to a first gate line, and the second gate electrode is electrically connected to a second gate line.

At least one embodiment of the present disclosure provides a display device, including an array substrate, a counter substrate and a liquid crystal layer disposed between the array substrate and the counter substrate, wherein, the array substrate is the array substrate provided by any of the embodiments of the present disclosure.

At least one embodiment of the present disclosure provides a driving method for the display device provided by any of the embodiments of the present disclosure, including: progressive scanning an array of the sub-pixels to display a frame of picture, wherein, for each sub-pixel, turning on the thin film transistor of the first sub-pixel portion through the first gate line, and applying a first data voltage to the first pixel electrode of the first sub-pixel portion through the data line; and turning on the thin film transistor of the second sub-pixel portion through the second gate line, and applying a second data voltage to the second pixel electrode of the second sub-pixel portion through the data line; wherein an absolute value of the first data voltage is not equal to that of the second data voltage.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
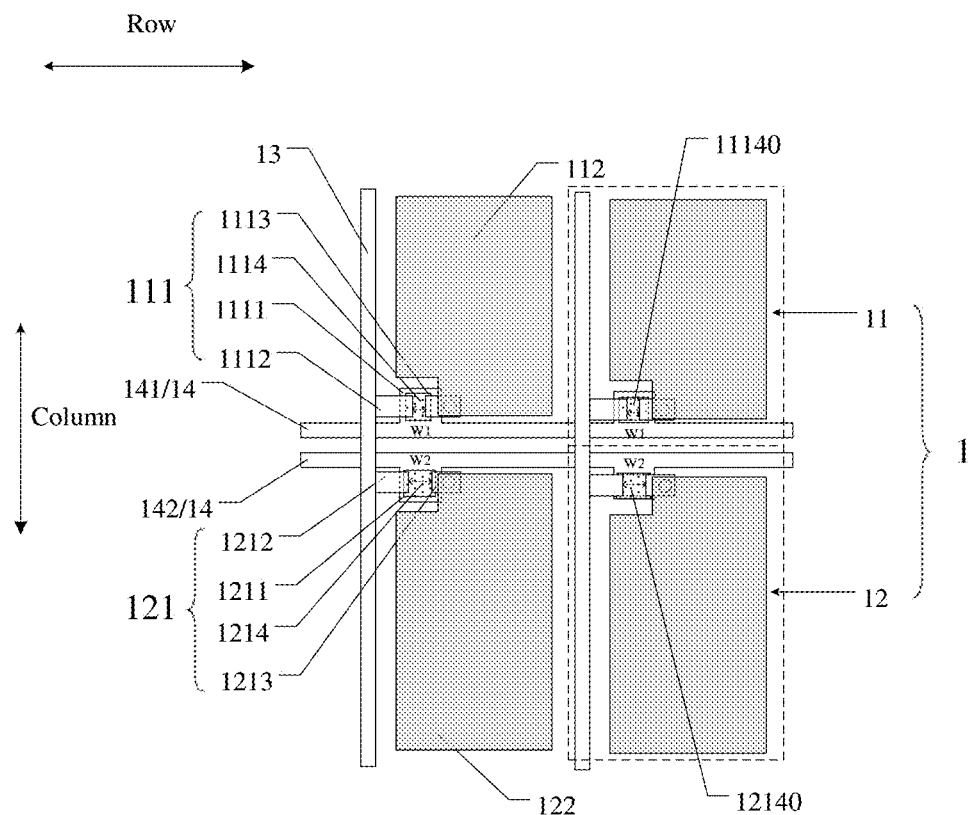
FIG. 1 is a schematic diagram of an array substrate provided by an embodiment of the present disclosure (a first source electrode, a first drain electrode, a second source electrode, a second drain electrode, a first pixel electrode and a second pixel electrode are subjected to semitransparent treatment)

In order to clarify the objects, technical solutions and advantages of the present disclosure, the technical solutions of embodiments of the present disclosure will be described in a clearly and fully understandable way in connection with the drawings of the embodiments of the present disclosure. It is obvious that the described embodiments are just a part but not all of the embodiments of the disclosure. Based on the described embodiments of the present disclosure herein, those ordinary skilled in the art can obtain all other embodiment(s), without any inventive work, which should be within the scope of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position is a described object is changed, the relative positional relationship may also be correspondingly changed.

At least one embodiment of the present disclosure provides an array substrate, including a plurality of sub-pixels, the plurality of sub-pixels being arranged in a plurality of rows and a plurality of columns, and each sub-pixel includes a first sub-pixel portion and a second sub-pixel portion adjacent to each other. The first sub-pixel portion includes a first thin film transistor and a first pixel electrode, and the first thin film transistor includes a first gate electrode, a first source electrode and a first drain electrode. The second sub-pixel portion includes a second thin film transistor and a second pixel electrode, and the second thin film transistor includes a second gate electrode, a second source electrode and a second drain electrode. The first drain electrode is electrically connected to the first pixel electrode, the second drain electrode is electrically connected to the second pixel electrode, the first source electrode and the second source electrode are electrically connected to the same data line, the first gate electrode is electrically connected to a first gate line, and the second gate electrode is electrically connected to a second gate line.

At least one embodiment of the present disclosure provides a display device, including an array substrate, a counter substrate and a liquid crystal layer disposed between the array substrate and the counter substrate, and the array substrate is the array substrate provided by any embodiment of the present disclosure.

At least one embodiment of the present disclosure provides a driving method for the display device provided by any embodiment of the present disclosure, which includes: performing progressive scanning on an array of the sub-pixels to display a frame of picture, and for each sub-pixel, turning on the thin film transistor of the first sub-pixel portion through the first gate line, and applying a first data voltage to the first pixel electrode of the first sub-pixel portion through the data line; turning on the thin film transistor of the second sub-pixel portion through the second gate line, and applying a second data voltage to the second pixel electrode of the second sub-pixel portion through the data line, an absolute value of the first data voltage being not equal to (different from) that of the second data voltage.

According to the array substrate and the display device provided by at least one embodiment of the present disclosure, one sub-pixel includes a first sub-pixel portion and a second sub-pixel portion adjacent to each other, the first sub-pixel portion and the second sub-pixel portion are connected to different gate lines and are electrically connected to the same data line, such that different data voltages are applied to the first sub-pixel portion and the second sub-pixel portion during progressive scanning. According to the driving method for the display device, in two different display regions of the same sub-pixel (the first sub-pixel portion and the second sub-pixel portion), liquid crystal molecules have different deflection angles, thereby realizing multi-domain display and different inversion manners, and improving the quality of a display picture.

Explanation is carried out by several embodiments in the following.

An Optional embodiment provides an array substrate, which, as shown in FIG. 1, comprises a plurality of sub-pixels 1, the plurality of sub-pixels 1 being arranged in a plurality of rows and a plurality of columns, and each sub-pixel 1 includes a first sub-pixel portion 11 and a second sub-pixel portion 12 adjacent to each other. The first sub-pixel portion 11 includes a first thin film transistor 111 and a first pixel electrode 112, and the first thin film transistor 111 includes a first gate electrode 1111, a first source electrode 1112 and a first drain electrode 1113. The second sub-pixel portion 12 includes a second thin film transistor 121 and a second pixel electrode 122, and the second thin film transistor 121 includes a second gate electrode 1211, a second source electrode 1212 and a second drain electrode 1213. The first drain electrode 1113 is electrically connected to the first pixel electrode 112, and the second drain electrode 1213 is electrically connected to the second pixel electrode 122; the first source electrode 1112 and the second source electrode 1212 are electrically connected to a same data line 13; the first gate electrode 1111 is electrically connected to a first gate line 141, and the second gate electrode 1211 is electrically connected to a second gate line 142.

According to the array substrate provided by the present embodiment, the first pixel electrode 112 and the second pixel electrode 122 are insulated from each other, and are respectively connected to different gate lines by different thin film transistors; therefore, different data voltages can be applied to the first sub-pixel portion 11 and the second sub-pixel portion 12 respectively. Therefore, in the same sub-pixel, liquid crystal molecules at the first sub-pixel portion 11 and the second sub-pixel portion 12 have different deflection angles respectively, thereby realizing multi-domain display.

In an example, as shown in FIG. 1, the first thin film transistor 111 further includes a first active layer 1114. The first source electrode 1112 and the first drain electrode 1113 respectively disposed on two sides of the first active layer 1114 and are electrically connected to the first active layer 1114. A portion of the first active layer 1114 between the first source electrode 1112 and the first drain electrode 1113 is a channel 11140. The second thin film transistor 121 further includes a second active layer 1214. The second source electrode 1212 and the second drain electrode 1213 are respectively disposed on two sides of the second active layer 1214 and are electrically connected to the second active layer 1214. A portion of the second active layer 1214 between the second source electrode 1212 and the second drain electrode 1213 is a channel 12140. The ratio of a channel width W1 of the first thin film transistor 111 (a distance between the first source electrode 1112 and the first drain electrode 1113 of the first active layer 1114) to a channel width W2 of the second thin film transistor 121 (a distance between the second source electrode 1212 and the second drain electrode 1213 of the second active layer 1214) is in direct proportion to the ratio of an area of the first pixel electrode 112 to an area of the second pixel electrode 122. For example, the area of the second pixel electrode 122 is twice the area of the first pixel electrode 112, and then the channel width W2 of the second thin film transistor 121 is twice the channel width W1 of the first thin film transistor 111. The channel width (W value) of each thin film transistor can be equi-proportionally adjusted according to an area ratio of the first sub-pixel portion 11 to the second sub-pixel portion 12 of each sub-pixel. Therefore, the charging and discharging of the first sub-pixel portion 11 and the second sub-pixel portion 12 in the same sub-pixel is enabled to have synchronism (the scanning row by row has delay, but the delay is small, and the first sub-pixel portion 11 and the second sub-pixel portion 12 can be charged to a required voltage simultaneously, therefore, the charging has synchronism and correspondingly, the discharging also has synchronism), color cast is effectively compensated, and uniformity of a display picture is improved.

In an example, as shown in FIG. 1, the first gate line 141 is located on a side of the first sub-pixel portion 11 adjacent to the second sub-pixel portion 12, and the second gate line 142 is located on a side of the second sub-pixel portion 12 adjacent to the first sub-pixel portion 11.

In an example, each row of sub-pixels 1 includes the sub-pixels 1 of different colors, and the sub-pixels 1 in each column are sub-pixels 1 of the same color. For example, one row of sub-pixels 1 includes three primary colors of Red, Green and Blue (RGB), and the sub-pixels in each column are the sub-pixels of one color of Red, Green and Blue. It should be noted that the color of the sub-pixels is not limited to the RGB.

In an example, the first sub-pixel portion 11 includes four domains, and the second sub-pixel portion 12 includes four domains. Therefore, in the same subpixel, rotary angles of liquid crystal molecules in the 4 domains are different from those of the liquid crystal molecules of the other 4 domains; 8 different liquid crystal orientation modes are realized, and 8-domain display is realized, thereby realizing multi-domain display. It should be noted that the number of the domains that the first sub-pixel portion 11 and the second sub-pixel 12 include is not limited thereto.

In an example, the first gate line 141, the first gate electrode 1111, the second gate electrode 1211 and the second gate line 142 can be formed by patterning a same metal layer. The data line 13, the first source electrode 1112, the first drain electrode 1113, the second source electrode 1212 and the drain electrode 1213 are formed by patterning a same metal layer. The first pixel electrode 112 and the second pixel electrode 122 can be electrically connected to the first drain electrode 1113 and the second drain electrode 1213 respectively by holes. For example, the first gate line 141, the first gate electrode 1111, the second gate electrode 1211 and the second gate line 142 can be formed on a same layer, then a first insulating layer is formed; the first active layer 1114 and the second active layer 1214 are formed on a same layer above the first insulating layer; the data line 13, the first source electrode 1112, the first drain electrode 1113, the second source electrode 1212 and the second drain electrode 1213 are formed on a same layer above the first active layer 1114 and the second active layer 1214; then a second insulating layer is formed; and the first pixel electrode 112 and the second pixel electrode 122 are formed on a same layer above the second insulating layer. It should be noted that structures of respective layers are not limited thereto and the structures of other layers can also be adopted.

Here, it should be understood that in the present disclosure, the "same layer" refers to that film layers for forming specific patterns are formed by a same film-forming process, and then a layer structures are formed with a same mask by a patterning process. According to different specific patterns, the patterning process may include repeated exposing, developing or etching processes, while the specific patterns in the formed layer structure can be continuous or discontinuous, and these specific patterns may be in different heights or have different thicknesses.

Figure 2:
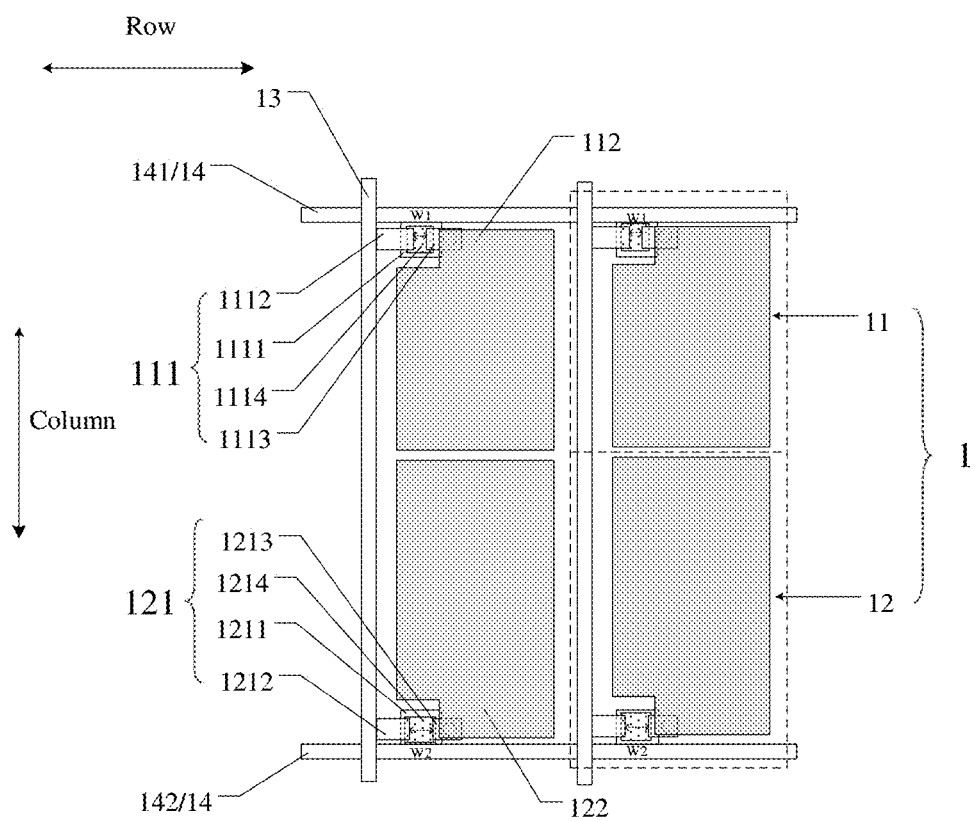
FIG. 2 is a schematic diagram of an array substrate provided by another embodiment of the present disclosure (a first source electrode, a first drain electrode, a second source electrode, a second drain electrode, a first pixel electrode and a second pixel electrode are subjected to semitransparent treatment)

In an optional embodiment, as shown in FIG. 2, the array substrate provided by the present embodiment differs from the above described embodiment 1 in that the first gate line 141 is located on a side of the first sub-pixel portion 11 away from the second sub-pixel portion 12, and the second gate line 142 is located on a side of the second sub-pixel portion 12 away from the first sub-pixel portion 11.

Figure 3:
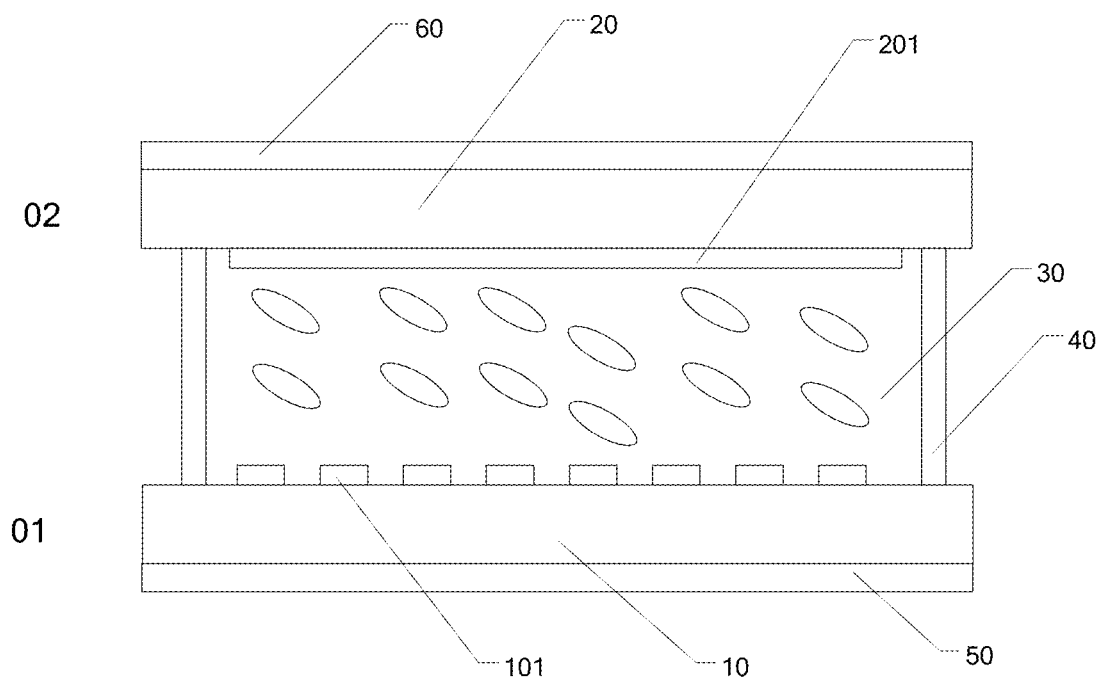
FIG. 3 is a sectional view of a display device provided by an embodiment of the present disclosure.

An optional embodiment provides a display device, which, as shown in FIG. 3, comprises an array substrate 01, a counter substrate 02 and a liquid crystal layer 30 disposed between the array substrate 01 and the counter substrate 02, and the array substrate 01 is any array substrate provided by any of the above described embodiments.

For example, as shown in FIG. 3, in the display device, the array substrate 01 includes a base substrate 10 and pixel electrodes 101 disposed thereon. The pixel electrodes 101 include the first pixel electrode 112 and the second pixel electrode 122 in any of the above described embodiments. The counter substrate 02 includes a base substrate 20 and a common electrode 201 disposed thereon. A perpendicular electric field can be formed between the pixel electrode 101 and the common electrode 201 to drive liquid crystal in a liquid crystal layer to rotate, so as to display.

FIG. 3 shows a lower polarizing film 50 and an upper polarizing film 60, and an included angle between a light transmission axis of the lower polarizing film 50 and that of the upper polarizing film 60 is 90 degrees. For example, the light transmission axis of the lower polarizing film 50 is parallel with a paper surface along a horizontal direction, and the light transmission axis of the upper polarizing film 60 is perpendicular to the paper surface.

For example, the directions of the respective four domains included in the first sub-pixel portion 11 are different, and an included angle of 45 degrees is formed between each of the four domains and the orthogonal light transmission axes of the upper and lower polarizing films; the directions of the respective four domains included in the second sub-pixel portion 12 are different, and an included angle of 45 degrees is formed between each of the four domains and the orthogonal light transmission axes of the upper and lower polarizing films.

An optional embodiment provides a driving method for any display device according to the above described embodiment, which includes: performing progressive scanning on an array of the sub-pixels 1 to display a frame of picture; and for each sub-pixel 1, turning on the thin film transistor 111 of the first sub-pixel portion 11 through the first gate line 141, and applying a first data voltage to the first pixel electrode 112 of the first sub-pixel portion 11 through the data line 13; turning on the thin film transistor 121 of the second sub-pixel portion 12 through the second gate line 142, and applying a second data voltage to the second pixel electrode 122 of the second sub-pixel portion 12 through the data line 13, an absolute value (amplitude or size) of the first data voltage being not equal to the absolute value (amplitude or size) of the second data voltage. Therefore, in the same sub-pixel, liquid crystal molecules of the first sub-pixel portion 11 and the second sub-pixel portion 12 (two adjacent regions, and the first sub-pixel portion 11 and the second sub-pixel portion 12 are adjacent to each other in an up and down relationship) have different deflection angles, thereby realizing multi-domain display and different inversion manners and improving the quality of a display picture.

Figure 4:
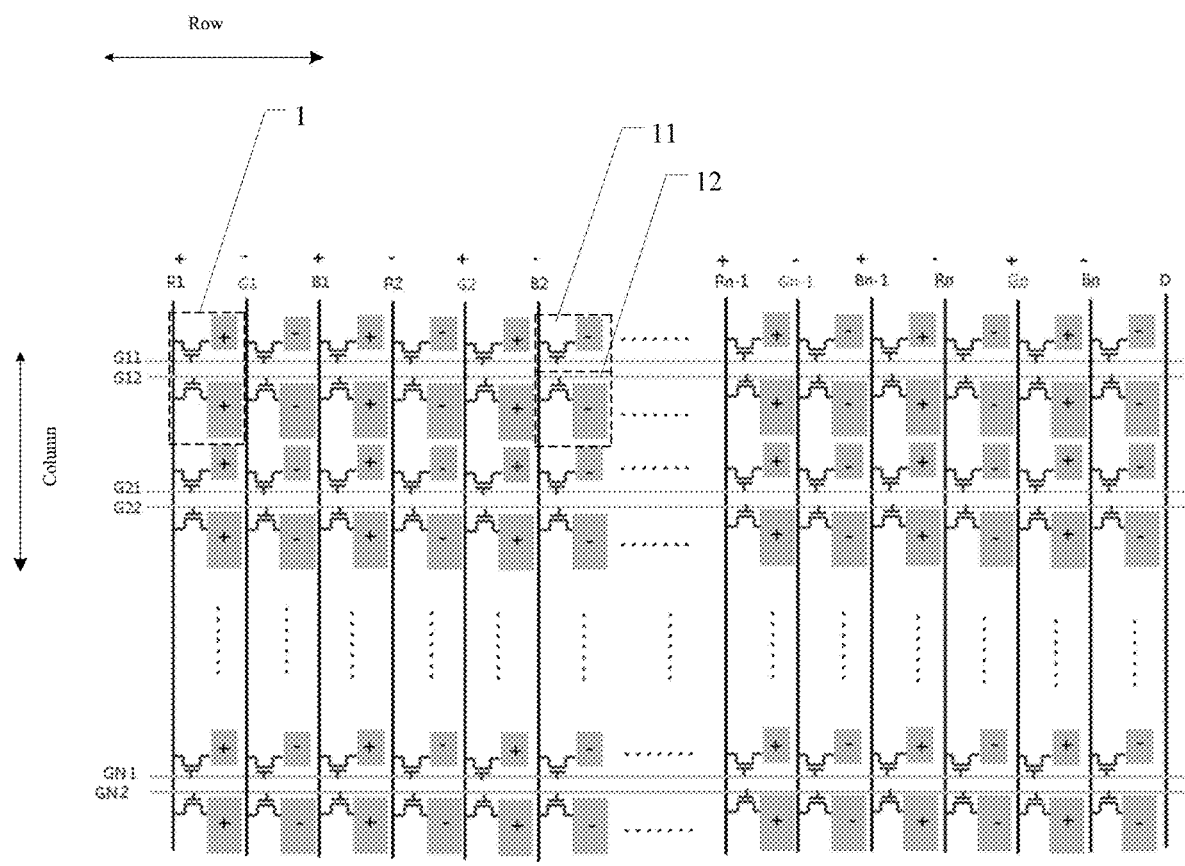
FIG. 4 is a schematic diagram of polarities of voltages applied to data lines in sub-pixels of a display device provided by an embodiment of the present disclosure.
Figure 5:
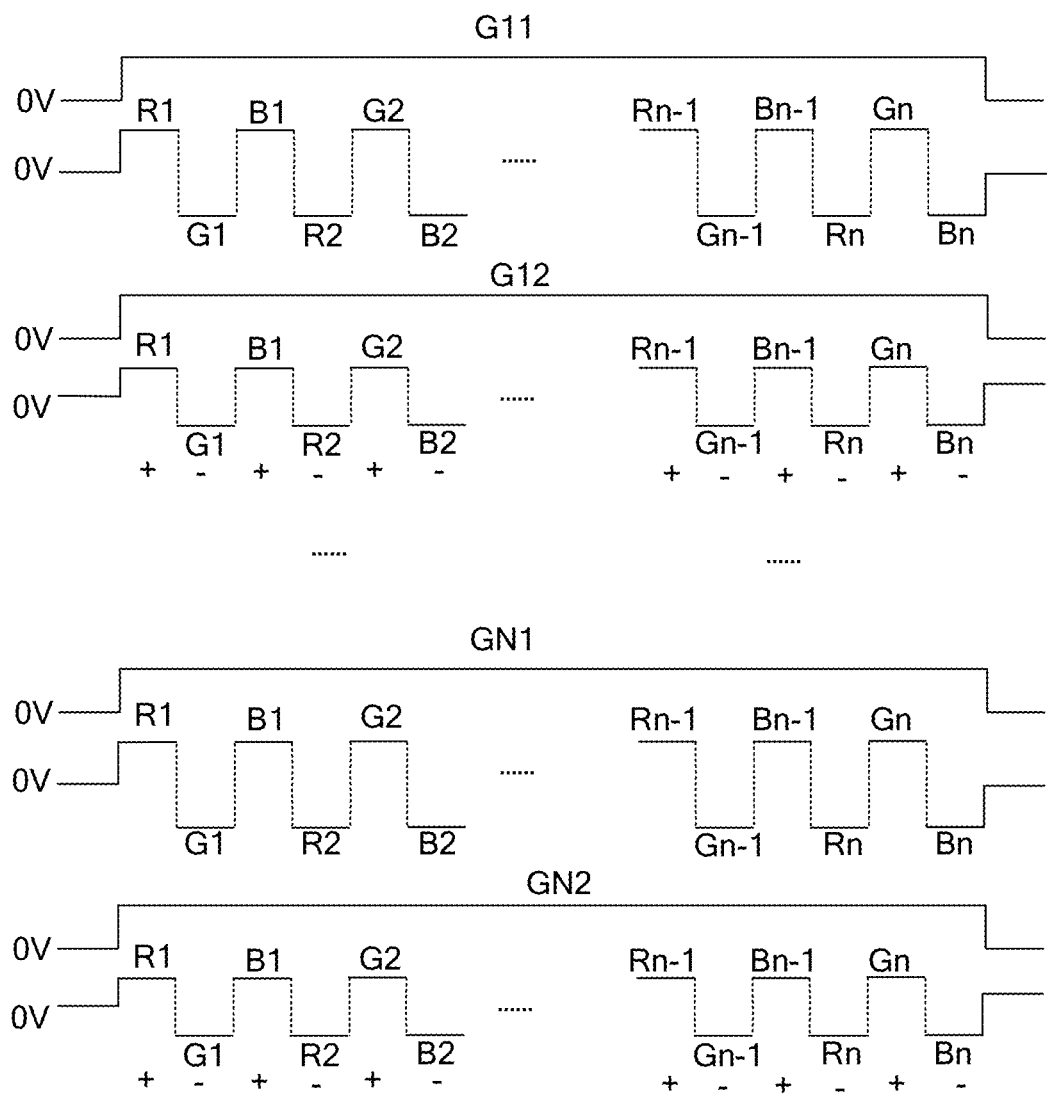
FIG. 5 is a schematic diagram of a driving timing sequence of a display device provided by an embodiment of the present disclosure.
Figure 6:
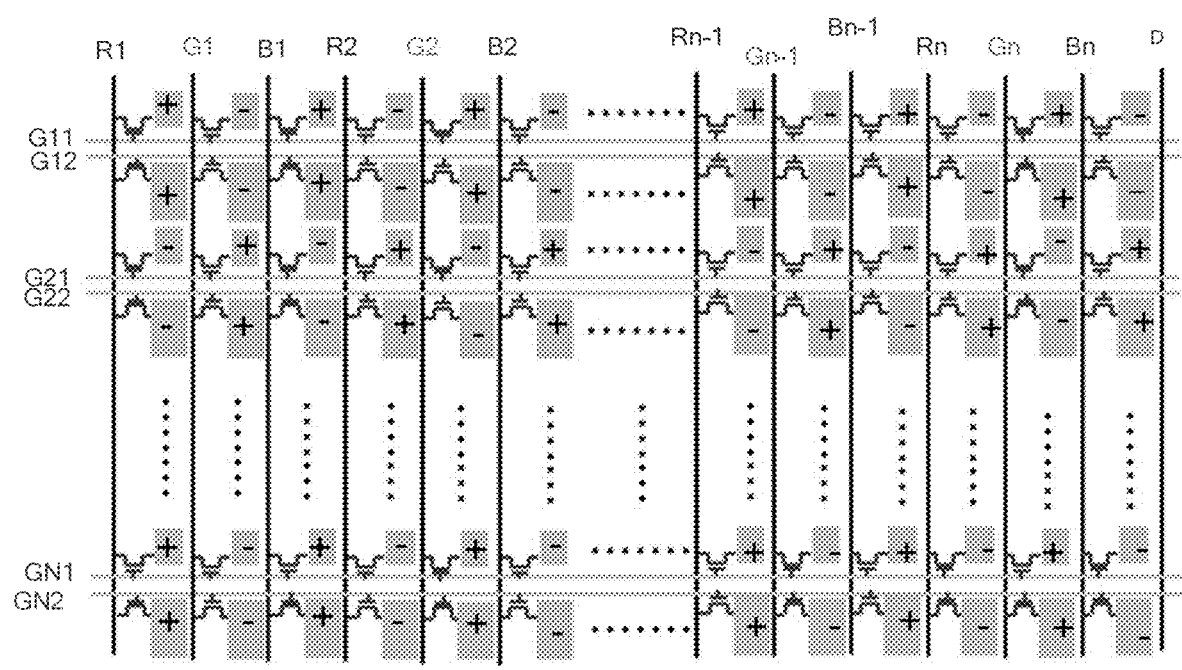
FIG. 6 is a schematic diagram of polarities of voltages applied to data lines in sub-pixels of a display device provided by an embodiment of the present disclosure.
Figure 7:
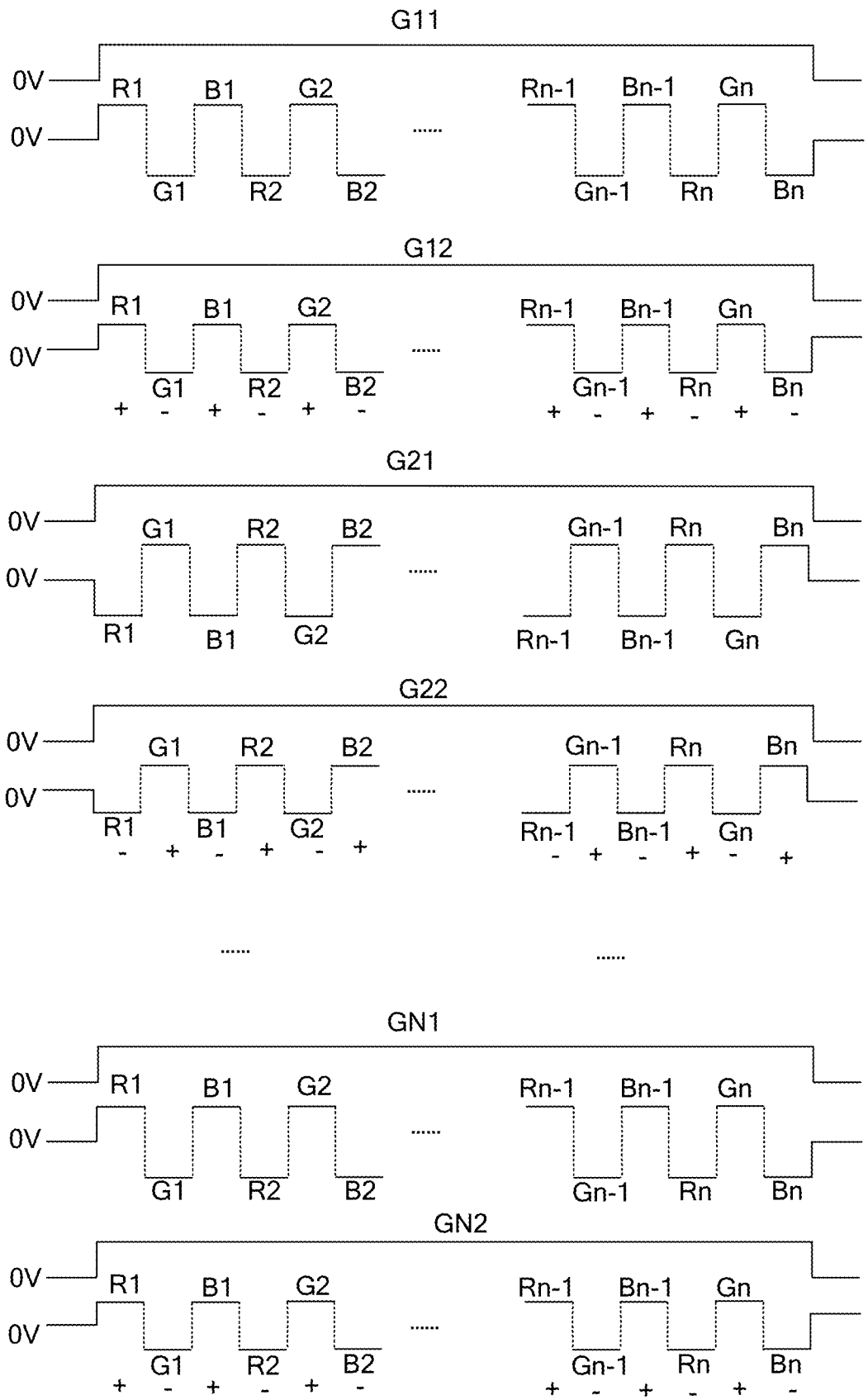
FIG. 7 is a schematic diagram of a driving timing sequence of a display device provided by an embodiment of the present disclosure.
Figure 8:
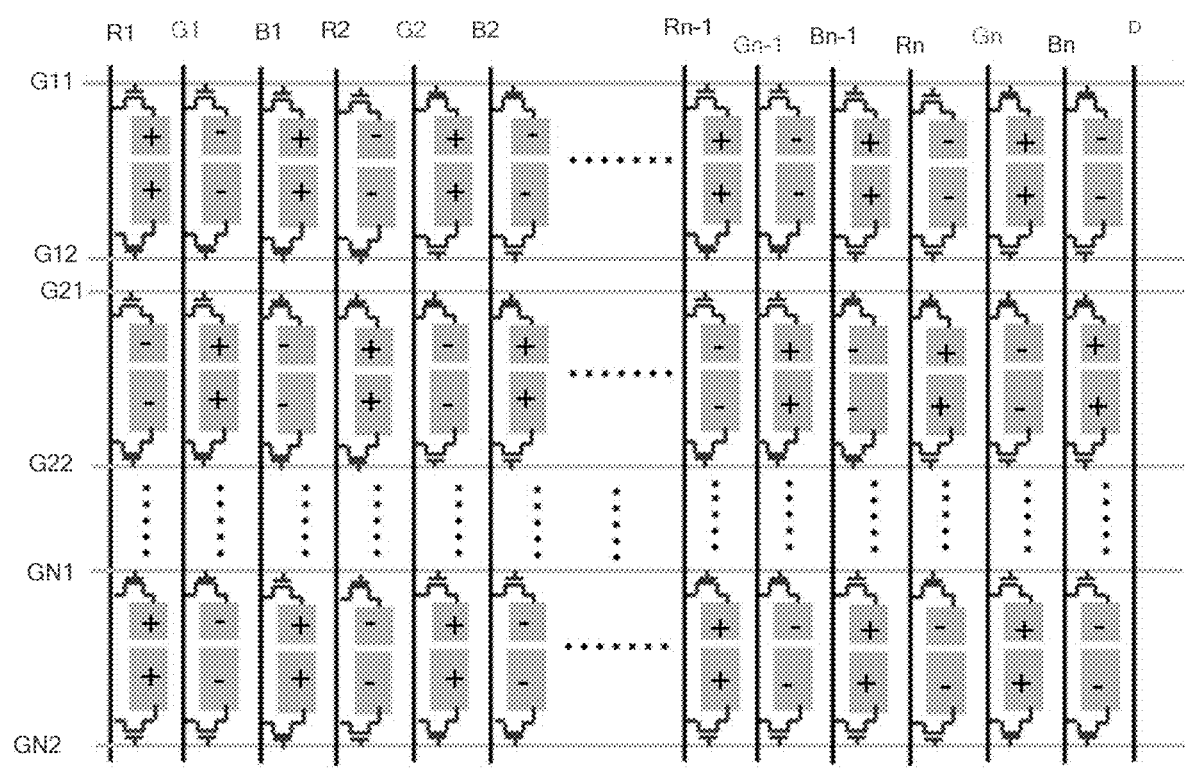
FIG. 8 is a schematic diagram of polarities of voltages applied to data lines in sub-pixels of a display device provided by an embodiment of the present disclosure.

The array substrate of a display device in FIGS. 4 and 6 can be as shown in FIG. 1, and the array substrate of a display device in FIG. 8 can be as shown in FIG. 2. FIGS. 4, 6 and 8 show a plurality of gate lines 14 arranged from top to bottom. The gate lines (GN) of the Nth row of sub-pixels include a first gate line GN1 and a second gate line GN2. The sub-pixels of red, green and blue colors in the same row of sub-pixels are sequentially arranged from left to right. The sub-pixels in the same column are of a same color. A dummy line D can be disposed on the rightmost side of the array substrate. FIG. 5 can be a schematic diagram of signals applied to the display device in FIG. 4. FIG. 7 can be a schematic diagram of signals applied to the display device in FIG. 6 or 8. The "+" or "−" in FIGS. 4 to 8 represents polarity of a voltage applied to the data line. In FIGS. 5 and 7, a corresponding pattern below a drive voltage of each gate line is the drive voltage of the data line. In the same frame time, column inversion and dot inversion are realized according to different polarities of the voltages of the data lines. FIG. 4 shows a column inversion manner, that is, the voltages of two adjacent columns of sub-pixels are opposite in polarity. FIGS. 6 and 8 show a dot inversion manner, that is, the voltages of two adjacent sub-pixels are opposite in polarity.

As shown in FIGS. 4 to 8, in the driving method for a display device provided by some examples, the first data voltage and the second data voltage are same in polarity.

As shown in FIG. 4, in the driving method for a display device provided by some examples, in the same column of sub-pixels 1, the data voltages applied to the adjacent two of the sub-pixels 1 are same in polarity.

As shown in FIG. 6, in the driving method for a display device provided by some examples, in the same column of sub-pixels 1, the data voltages applied to the adjacent two of the sub-pixels 1 are opposite in polarity.

As shown in FIGS. 6 and 8, in the driving method for a display device provided by some examples, in the same row of sub-pixels 1, the data voltages applied to the adjacent two of the sub-pixels 1 are opposite in polarity.

It should be noted that the colors of the sub-pixels are not limited to the embodiments above. Each column of sub-pixels 1 can include sub-pixels 1 of different colors, and the sub-pixels 1 in each row can be of a same color, which is not limited by the embodiments of the present disclosure. In the embodiments of the present disclosure, the thin film transistors are not limited to the scenario described in the drawings, and the thin film transistors of other type such as U-shaped thin film transistors can also be adopted, which is not limited by the embodiments of the present disclosure.

The following statements should be noted:

(1) Unless otherwise defined, the same reference numeral refers to the same meaning in the present disclosure and the accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a region may be enlarged. However, it should understood that, in the case in which a component or element such as a layer, film, region, substrate or the like is referred to be "on" or "under" another component or element, it may be directly on or under the another component or element or a component or element is interposed therebetween.

(4) In case of no conflict, features in one embodiment or in different embodiments can be combined.

The foregoing is only the embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The application claims priority to the Chinese patent application No. 201610798599.7, filed on Aug. 31, 2016, the present disclosure of which is incorporated herein by reference as part of the application.

The invention claimed is:

1. An array substrate, comprising a plurality of sub-pixels arranged in a plurality of rows and a plurality of columns, wherein each sub-pixel includes a first sub-pixel portion and a second sub-pixel portion adjacent to each other, and the first sub-pixel portion and the second sub-pixel portion have a same color, the first sub-pixel portion includes a first thin film transistor and a first pixel electrode, and the first thin film transistor includes a first gate electrode, a first source electrode, and a first drain electrode, the second sub-pixel portion includes a second thin film transistor and a second pixel electrode, and the second thin film transistor includes a second gate electrode, a second source electrode, and a second drain electrode, and the first drain electrode is electrically connected to the first pixel electrode, the second drain electrode is electrically connected to the second pixel electrode, the first source electrode and the second source electrode are electrically connected to a same data line, the first gate electrode is electrically connected to a first gate line, and the second gate electrode is electrically connected to a second gate line, wherein the first thin film transistor of the first sub-pixel portion and the second thin film transistor of the second sub-pixel portion are turned on in sequence through the first gate line and the second gate line, to apply a first data voltage and a second data voltage to the first pixel electrode and the second pixel electrode in sequence respectively by the same data line, an absolute value of the first data voltage is not equal to that of the second data voltage, and a ratio of a channel width of the first thin film transistor to a channel width of the second thin film transistor is in direct proportion to a ratio of an area of the first pixel electrode to an area of the second pixel electrode, so that the first pixel electrode and the second pixel electrode are charged and discharged simultaneously.

2. The array substrate according to claim 1, wherein the first gate line is located on aside of the first sub-pixel portion away from the second sub-pixel portion, and the second gate line is located on a side of the second sub-pixel portion away from the first sub-pixel portion.

3. The array substrate according to claim 1, wherein the first gate line is located on a side of the first sub-pixel portion adjacent to the second sub-pixel portion, and the second gate line is located on a side of the second sub-pixel portion adjacent to the first sub-pixel portion.

4. The array substrate according to claim 1, wherein each row includes sub-pixels of different colors, and each column comprises sub-pixels of a same color; or each column includes sub-pixels of different colors, and each row comprises sub-pixels of the same color.

5. A display device, comprising an array substrate, a counter substrate, and a liquid crystal layer disposed between the array substrate and the counter substrate, wherein the array substrate is the array substrate according to claim 1.

6. The display device according to claim 5, wherein the counter substrate includes a common electrode.

7. A display device, comprising an array substrate, a counter substrate, a liquid crystal layer disposed between the array substrate and the counter substrate, an upper polarizing film provided on the counter substate, and a lower polarizing film provided on the array substrate with an included angle between a light transmission axis of the lower polarizing film and a light transmission axis of the upper polarizing film being 90 degrees, wherein the array substrate comprises a plurality of sub-pixels arrange in a plurality of rows and a plurality of columns, wherein each sub-pixel includes a first sub-pixel portion and a second sub-pixel portion adjacent to each other, and the first sub-pixel portion and the second sub-pixel portion have a same color, the first sub-pixel portion includes a first thin film transistor and a first pixel electrode, and the first thin film transistor includes a first gate electrode, a first source electrode, and a first drain electrode, the second sub-pixel portion includes a second thin film transistor and a second pixel electrode, and the second thin film transistor includes a second gate electrode, a second source electrode, and a second drain electrode, and the first drain electrode is electrically connected to the first pixel electrode, the second drain electrode is electrically connected to the second pixel electrode, the first source electrode and the second source electrode are electrically connected to a same data line, the first gate electrode is electrically connected to a first gate line, and the second gate electrode is electrically connected to a second gate line, wherein the first sub-pixel portion includes four domains, and the second sub-pixel portion includes foud domains, directions of the respective four domains of the first sub-pixel portion aree different, diretions of the respective four domains of the second sub-pixel portion are different, and included angle of 45 degrees is formed between each of the four domains of the first sub-pixel portion and the light transmission axes of the upper and lower polarizing films, and an included angle of 45 degrees is formed between each of the four domains of the second sub-pixel portion and the light transmission axes of the upper and lower polarizing films, a first data voltage and a second data voltage are applied to the first pixel electrode and the second pixel electrode respectively, an absolute value of the first data voltage is not equal to that of the second data voltage, so that liquid crystal molecules of the liquid crystal layer corresponding in position to the respective four domains of the first sub-pixel portion have different deflection angles and liquid crystal molecules of the liquid crystal layer corresponding in position to the respective four domains of the second sub-pixel portion have different deflection angles.

8. The display device according to claim 7, wherein a ratio of a channel width of the first thin film transistor to a channel width of the second thin film transistor is in direct proportion to a ratio of an area of the first pixel electrode to an area of the second pixel electrode.

9. The display device according to claim 7, wherein the first gate line is located on a side of the first sub-pixel portion away from the second sub-pixel portion, and the second gate line is located on a side of the second sub-pixel portion away from the first sub-pixel portion.

10. The display device according to claim 7, wherein the first gate line is located on a side of the first sub-pixel portion adjacent to the second sub-pixel portion, and the second gate line is located on a side of the second sub-pixel portion adjacent to the first sub-pixel portion.

11. The display device according to claim 7, wherein each row includes sub-pixels of different colors, and each column comprises sub-pixels of a same color; or each column includes sub-pixels of different colors, and each row comprises sub-pixels of the same color.

12. The display device according to claim 7, wherein the counter substrate includes a common electrode.

13. A driving method for a display device, wherein the display device comprises an array substrate, a counter substrate, and a liquid crystal layer disposed between the array substrate and the counter substrate, wherein the array substrate comprises a plurality of sub-pixels arranged in a plurality of rows and a plurality of columns, wherein each sub-pixel includes a first sub-pixel portion and a second sub-pixel portion adjacent to each other, and the first sub-pixel portion and the second sub-pixel portion have a same color, the first sub-pixel portion includes a first thin film transistor and a first pixel electrode, and the first thin film transistor includes a first gate electrode, a first source electrode, and a first drain electrode, the second sub-pixel portion includes a second thin film transistor and a second pixel electrode, and the second thin film transistor includes a second gate electrode, a second source electrode, and a second drain electrode, and the first drain electrode is electrically connected to the first pixel electrode, the second drain electrode is electrically connected to the second pixel electrode, the first source electrode and the second source electrode are electrically connected to a same data line, the first gate electrode is electrically connected to a first gate line, and the second gate electrode is electrically connected to a second gate line, wherein a ratio of a channel width of the first thin film transistor to a channel width of the second thin film transistor is in direct proportion to a ratio of an area of the first pixel electrode to an area of the second pixel electrode, the driving method comprising:

progressive scanning an array of the sub-pixels to display a frame of picture, wherein, for each sub-pixel, the driving method further comprises:
turning on the first thin film transistor of the first sub-pixel portion through the first gate line, and applying a first data voltage to the first pixel electrode of the first sub-pixel portion through the data line; and turning on the second thin film transistor of the second sub-pixel portion through the second gate line, and applying a second data voltage to the second pixel electrode of the second sub-pixel portion through the data line, wherein an absolute value of the first data voltage is not equal to that of the second data voltage, so that the first pixel electrode and the second pixel electrode are charged and discharged simultaneously.

14. The driving method for the display device according to claim 13, wherein the first data voltage and the second data voltage are same in polarity.

15. The driving method for the display device according to claim 13, wherein in a same column of sub-pixels, data voltages applied to an adjacent two of the sub-pixels are same in polarity.

16. The driving method for the display device according to claim 13, wherein in a same column of sub-pixels, data voltages applied to an adjacent two of the sub-pixels are opposite in polarity.

17. The driving method for the display device according to claim 13, wherein in a same row of sub-pixels, data voltages applied to an adjacent two of the sub-pixels are opposite in polarity.

* * * * *